(12) United States Patent
Ikeda et al.

(10) Patent No.: US 7,551,906 B2
(45) Date of Patent: Jun. 23, 2009

(54) AM/FM RADIO RECEIVER AND LOCAL OSCILLATOR CIRCUIT USED THEREIN

(75) Inventors: Takeshi Ikeda, Tokyo (JP); Hiroshi Miyagi, Kanagawa (JP)

(73) Assignee: Niigata Seimitsu Co., Ltd., Jyoetsu-shi (JP)

(*) Notice: Subject to any disclaimer, the term of this patent is extended or adjusted under 35 U.S.C. 154(b) by 459 days.

(21) Appl. No.: 11/383,087

(22) Filed: May 12, 2006

(65) Prior Publication Data

US 2006/0199555 A1   Sep. 7, 2006

Related U.S. Application Data

(63) Continuation of application No. PCT/JP2004/010239, filed on Jul. 12, 2004.

(30) Foreign Application Priority Data

Nov. 26, 2003   (JP) .............................. 2003-396077

(51) Int. Cl.
*H04B 1/18* (2006.01)
*H04B 7/00* (2006.01)

(52) U.S. Cl. ............... 455/165.1; 455/255; 455/260

(58) Field of Classification Search ............. 455/76, 455/165.1, 255, 260, 183.1, 259, 316, 141, 455/148, 93, 142; 331/34, 18, 30
See application file for complete search history.

(56) References Cited

U.S. PATENT DOCUMENTS

| 4,135,158 A | 1/1979 | Parmet | |
|---|---|---|---|
| 4,361,906 A * | 11/1982 | Sakamoto | 455/140 |
| 5,430,890 A | 7/1995 | Vogt et al. | |
| 5,923,715 A * | 7/1999 | Ono | 375/376 |
| 6,081,571 A * | 6/2000 | Jansson | 375/376 |
| 7,013,121 B1 * | 3/2006 | Koh | 455/314 |
| 7,272,374 B2 * | 9/2007 | Tuttle et al. | 455/333 |
| 7,432,769 B2 * | 10/2008 | Kato et al. | 331/74 |

(Continued)

FOREIGN PATENT DOCUMENTS

CN   1246219   3/2000

(Continued)

OTHER PUBLICATIONS

Chinese Office Action dated Mar. 13, 2009.

*Primary Examiner*—Sonny Trinh
(74) *Attorney, Agent, or Firm*—Connolly Bove Lodge & Hutz LLP; Myron Keith Wyche

(57) ABSTRACT

A couple of frequency doubler circuits 21 and 22 which multiplys a frequency of a reference oscillation signal outputted from a reference oscillator 12 is provided, thereby a frequency of a reference oscillation signal, as the greatest common divisor between a frequency (300 KHz) determined by multiplying the frequency (fx=75 KHz) of a crystal oscillator 11 by four and a frequency (54 KHz) determined by multiplying an assigned frequency per one channel in AM radio broadcasting by a prescribed divide ratio, can be higher than a conventional frequency. This way realizes the decrease of a divide ratio in a programmable counter 17, resulting in the reduction of the circuit scale, shortening of the lock-up time, and improvement of the S/N ratio.

22 Claims, 3 Drawing Sheets

U.S. PATENT DOCUMENTS

| | | |
|---|---|---|
| 2001/0043109 A1 | 11/2001 | Masumoto et al. |
| 2006/0035612 A1* | 2/2006 | Miyagi et al. ............ 455/226.1 |
| 2006/0135112 A1* | 6/2006 | Matsumoto ................. 455/334 |
| 2007/0129041 A1* | 6/2007 | Yokoyama et al. .......... 455/280 |

FOREIGN PATENT DOCUMENTS

| | | |
|---|---|---|
| DE | 19946494 | 5/2001 |
| JP | 2002-151960 | 5/2002 |

* cited by examiner

AM/FM RADIO RECEIVER AND LOCAL OSCILLATOR CIRCUIT USED THEREIN

BACKGROUND OF THE INVENTION

1. Field of the Invention

The present invention relates to an AM/FM radio receiver and local oscillator circuit used therein. Specifically, the present invention relates to an AM/FM radio receiver having a configuration so as to generate local oscillation signals for AM and FM broadcasting by one frequency synthesizer using a phase locked loop (PLL) circuit.

2. Description of the Related Art

The superheterodyne system is mainly used in the present commercially available radio receivers. According to this system, the signal of the desired broadcast wave is received by converting the frequency of the desired broadcast wave into a center frequency of an intermediate bandpass filter without changing the center frequency and band characteristics of the intermediate bandpass filter. Conversion of the frequency is done by mixing a high frequency amplified receiving signal and a local oscillation signal with a frequency corresponding to the tuning direction.

The inaccurate frequency of the local oscillation signal causes a deviation of the converted frequency from the center frequency of the intermediate bandpass filter. Therefore, a local oscillation signal with a high-accurate and less-variable frequency is demanded. The PLL frequency synthesizer (hereinafter referred to simply as "PLL circuit") which is easily controlled by a microcomputer is recently used to the circuit which generates the local oscillation signal. In general, a crystal oscillator which generates a high-accurate and less-variable frequency is used to a reference frequency generator used in the circuit.

A number of commercially available radio receivers may receive both AM and FM broadcast wave. The technologies comprising one PLL circuit which functions as both a circuit for generating the local oscillation signal for converting the AM broadcast wave and a circuit for generating the local oscillation signals for converting the FM broadcast wave are conventionally provided (see Patent Documents 1 and 2).

Patent Document 1: Japanese Patent Application Laid-open No. H8-149031

Patent Document 2: Japanese Patent Application Laid-open No. 2000-165277

FIG. 1 is a functional block diagram showing an example of partial configuration of a radio receiver comprising one PLL circuit for both AM and FM broadcast. As shown in FIG. 1, this type of radio receivers comprises an antenna for FM 1, high frequency amplifier circuit for FM 2, mixer circuit for FM 3, intermediate frequency amplifier circuit for FM 4, antenna for AM 5, high frequency amplifier circuit for AM 6, mixture circuit for AM 7, intermediate frequency amplifier circuit for AM 8, PLL circuit for both AM and FM 9, and divider for AM 10.

In the high frequency amplifier circuit for FM 2, the specific frequency band of the broadcast wave received with the antenna for FM 1 is selectively amplified. The frequency converter for FM consisting of the mixer circuit for FM 3 and PLL circuit 9 mixes a carrier signal with a frequency of $f_{FMRX}$ outputted from the high frequency amplifier circuit for FM 2 and a local oscillation signal with a frequency of $f_{FMLO}$ outputted from the PLL circuit 9 to convert the frequencies, generating an signal with an intermediate frequency (for example, $f_{FMRX} - f_{FMLO} = 10.7$ MHz) to be outputted. The intermediate frequency signal passed through the mixture circuit for FM 3 is amplified in the intermediate frequency amplifier circuit for FM 4.

In FM broadcasting in Japanese band, the allocated frequency is in the range of 76.1-89.9 MHz and the bandwidth occupied by one channel is 100 KHz. Since the local oscillation frequency $f_{FMLO}$ of each channel required for tuning is lower by 10.7 MHz than the carrier frequency $f_{FMRX}$ of the channel, the PLL circuit 9 outputs the signal with a frequency of $f_{FMLO}$ in 65.4-79.2 MHz as the local oscillation signal for selecting FM broadcast wave.

On the other hand, the high frequency amplifier circuit for AM 6 selectively amplifies the specific frequency band of the broadcasting wave received with the antenna for AM 5 in general. The frequency converter for AM consisting of the mixer circuit for AM 7, PLL circuit 9, and divider 10 mixes a carrier signal with a frequency of $f_{AMRX}$ outputted from the high frequency amplifier circuit for AM 6 and a local oscillation signal with a frequency of $f_{AMLO}$, which is a frequency outputted from the PLL circuit 9 and divided by N in the divider 10, to convert the frequencies, generating a signal with an intermediate frequency (for example, $f_{AMLO} - f_{AMRX} = 10.7$ MHz) to be outputted. The intermediate frequency signal passed through the mixer circuit for AM 7 is amplified in the intermediate frequency amplifier circuit for AM 8.

In AM broadcasting in Japanese band, the allocated frequency is 531-1620 KHz and the bandwidth occupied by one channel is 9 KHz. Since the local oscillation frequency $f_{AMLO}$ of each channel required for tuning is higher by 10.7 MHz than the carrier frequency $f_{AMRX}$ of the channel, the divider 10 divides the frequency $f_{AMLO}$ of the local oscillation signal of 65.4-79.2 MHz outputted from the PLL circuit 9 by N to output the signal with a frequency $f_{AMLO}$ of 11.231-12.320 MHz in the divided frequency as the local oscillation signal for AM broadcasting selection.

The frequency $f_{AMLO}$ of 11.231-12.320 MHz multiplied by six is 67.386-73.920 MHz which is within the range of 65.4-79.2 MHz for the frequency $f_{FMLO}$ of the local oscillation signal for FM broadcasting selection outputted by the PLL circuit 9. Therefore, the local oscillation signal for FM and AM broadcasting can be obtained from one PLL circuit 9 by using the divider 10 with a divide ratio of 1/6 (N=6).

As mentioned above, the local oscillation signal outputted from the PLL circuit 9 is demanded to have a high degree of accuracy and small frequency variation. Therefore, a crystal oscillator with the high-accurate and less-variable frequency is used in the PLL circuit 9 in many cases. FIG. 2 shows the configuration example of the conventional PLL circuit 9 using the crystal oscillator.

As shown in FIG. 2, the PLL circuit 9 comprises a crystal oscillator 11, reference oscillator (OSC) 12, divider 13, phase comparator 14, low pass filter (LPF) 15, voltage-controlled oscillator (VCO) 16, and programmable counter (PC) 17. The reference oscillator 12 generates the reference oscillation signal with the reference frequency using the crystal oscillator 11. The divider 13, which has two divide ratios for FM and AM and is switchable to either ratio, divides the frequency of the reference oscillation signal to be outputted to the phase comparator 14.

The phase comparator 14 compares phases between the reference oscillation signal from the divider 13 and the outputted signal from the programmable counter 17 and outputs the voltage corresponding to the phase difference to the low pass filter 15. The low pass filter 15 removes the undesired frequency outputted from the phase comparator 14 and generates the direct current control voltage to be supplied to the voltage-controlled oscillator 16. The voltage-controlled oscillator 16 varies the oscillation frequency according to the voltage outputted from the low pass filter 15 and outputs the reference clock controlled to be in synchronization with the reference signal. The programmable counter 17 divides the reference clock by the divide ratio corresponding to the selection frequency and outputs the divided clock signal to the phase comparator 14.

The PLL circuit 9 having such configuration operates as described below. The reference oscillation signal outputted from the reference oscillator 12 is divided in the divider 13, being inputted to the phase comparator 14. The local oscillation signal outputted from the voltage-controlled oscillator 16 is divided with the divide ratio corresponding to the selection frequency in the programmable counter 17, being inputted to the phase comparator 14.

The phase comparator 14 compares the phases between the reference oscillation signal from the divider 13 and the outputted signal from the programmable counter 17 to output the voltage corresponding to the phase difference to the voltage-controlled oscillator 16 via the low pass filter 15. With these operations as mentioned above, the local oscillation signal outputted from the voltage-controlled oscillator 16 to the mixer circuit for FM 3 as well as the divider for AM 10 is controlled to be in synchronization with the reference oscillation signal from the divider 13.

Since the divide ratio in the divider for AM 10 is 1/6 and the bandwidth occupied by each channel in the AM broadcasting is 9 KHz as mentioned above, the frequency $f_r$ of the reference oscillation signal outputted from the divider 13 during the AM broadcasting selection needs to be 54 KHz. However, a crystal oscillator which generates a low frequency fx of 75 KHz is generally used as the crystal oscillator 11 in radio receivers because the harmonic component is superimposed on the broadcast band and the reception sensitivity deteriorates if the oscillation frequency fx is high.

Being unable to generate the reference oscillation signal with a frequency of 54 KHz by the divider 13 when the crystal oscillator 11 with a frequency of 75 KHz is employed, the divider 13 practically generates the reference oscillation signal with a frequency $f_r$ of 3 KHz which is the greatest common divisor between 75 KHz, the oscillation frequency of the crystal oscillator 11, and 54 KHz, the frequency of the reference oscillation signal required for AM broadcasting.

However, the smaller the frequency $f_r$ of the reference oscillation signal, the greater the divide ratio in the programmable counter 17 which results in the following problems:
1. The scale expansion of the circuit because the number of columns in the flip flop circuit constituting the programmable counter 17 must be increased.
2. The extension of a lock-up time in the PLL circuit.
3. The deterioration in S/N ratio.

SUMMARY OF THE INVENTION

The present invention is to solve these problems and it is an object of the present invention to provide a radio receiver having a configuration for generating local oscillation signals for AM and FM broadcasting with one PLL circuit, with which a frequency of a reference oscillation signal as a reference when the local oscillation signals are generated can be comparatively high.

To solve the above-mentioned problems, the present invention provides an AM/FM radio receiver comprising a local oscillation circuit which generates a local oscillation signal, first mixture circuit which mixes the local oscillation signal outputted from the local oscillation circuit and a FM radio broadcast signal to generate an intermediate frequency signal for FM broadcasting, first divide circuit which divides the local oscillation signal outputted from the local oscillation circuit, and second mixture circuit which mixes the local oscillation signal divided in the first divide circuit and an AM radio broadcast signal to generate an intermediate frequency signal for AM broadcasting, wherein the local oscillation circuit comprises an oscillator which operates with a prescribed reference frequency, reference oscillator which generates a reference oscillation signal using the oscillator, frequency doubler circuit which multiplies the frequency of the reference oscillation signal outputted from the reference oscillator, and second divide circuit which divides the reference oscillation signal outputted from the frequency doubler circuit to generate a reference oscillation signal with a frequency of the greatest common divisor between the frequency of the reference oscillation signal outputted from the frequency doubler circuit and an assigned frequency per one channel in AM radio broadcasting or the frequency determined by multiplying the assigned frequency divided by an integer by a divide ratio of the first divide circuit.

Another embodiment of the present invention provides an AM/FM radio receiver wherein a second divide circuit which divides the reference oscillation signal outputted from a frequency doubler circuit to generate a reference oscillation signal with a frequency of the greatest common divisor between the frequency of the reference oscillation signal outputted from the frequency doubler circuit and an assigned frequency per one channel in FM radio broadcasting or the assigned frequency divided by an integer.

Another embodiment of the present invention provides an AM/FM radio receiver wherein a reference frequency of an oscillator is 75 KHz, assigned frequency per one channel in AM radio broadcasting is 9 KHz, divide ratio of a first divide circuit is 1/6, and frequency determined by multiplying the assigned frequency per one channel in AM radio broadcasting by the divide ratio of the first divide circuit is 54 KHz.

Another embodiment of the present invention provides an AM/FM radio receiver wherein a reference frequency of an oscillator is 75 KHz, assigned frequency per one channel in AM radio broadcasting is 10 KHz, divide ratio of a first divide circuit is 1/8 or 1/10, and frequency determined by multiplying the assigned frequency per one channel in AM radio broadcasting by the divide ratio of the first divide circuit is 80 or 100 KHz.

Another embodiment of the present invention provides an AM/FM radio receiver wherein a reference frequency of an oscillator is 75 KHz, assigned frequency per one channel in AM radio broadcasting is 9 KHz, divide ratio of a first divide circuit is 1/8 or 1/10, and frequency determined by multiplying the assigned frequency per one channel in AM radio broadcasting by the divide ratio of the first divide circuit is 72 or 90 KHz.

Another embodiment of the present invention provides an AM/FM radio receiver wherein a reference frequency of an oscillator is 75 KHz and assigned frequency per one channel in FM radio broadcasting is 50, 100, or 200 KHz.

Another embodiment of the present invention provides an AM/FM radio receiver wherein a frequency doubler circuit multiplies the frequency of the reference oscillation signal outputted from the reference oscillator by two's power, for example by $2^2$.

Still another embodiment of the present invention provides an AM/FM radio receiver further comprising a clock generating circuit which generates a clock signal to be supplied to a switched capacitor filter having a configuration so that passband characteristics are variable by changing the capacity of the switched capacitor.

The present invention further provides a local oscillation circuit including an oscillator which operates with a prescribed reference frequency, reference oscillator which generates a reference oscillation signal using the oscillator, frequency doubler circuit which multiplies the frequency of the reference oscillation signal outputted from the reference oscillator, and divide circuit which divides the reference oscillation signal outputted from the frequency doubler circuit to generate a reference oscillation signal with a frequency of the greatest common divisor between the frequency of the reference oscillation signal outputted from the frequency doubler circuit and an assigned frequency per one channel in AM radio broadcasting or the frequency determined by multiplying the assigned frequency divided by an integer by a prescribed value.

Another embodiment of the present invention provides a local oscillation circuit wherein a divide circuit which divides the reference oscillation signal outputted from the frequency doubler circuit to generate a reference oscillation signal with a frequency of the greatest common divisor between the frequency of the reference oscillation signal outputted from the frequency doubler circuit and an assigned frequency per one channel in FM radio broadcasting or the assigned frequency divided by an integer.

Another embodiment of the present invention provides a local oscillation circuit wherein a reference frequency of an oscillator is 75 KHz, assigned frequency per one channel in AM radio broadcasting is 9 KHz, prescribed value is 6, and frequency determined by multiplying the assigned frequency per one channel in AM radio broadcasting by the prescribed value is 54 KHz.

Another embodiment of the present invention provides a local oscillation circuit wherein a reference frequency of an oscillator is 75 KHz, assigned frequency per one channel in AM radio broadcasting is 10 KHz, prescribed value is 8 or 10, and frequency determined by multiplying the assigned frequency per one channel in AM radio broadcasting by the prescribed value is 80 or 100 KHz.

Another embodiment of the present invention provides a local oscillation circuit wherein a reference frequency of an oscillator is 75 KHz, assigned frequency per one channel in AM radio broadcasting is 9 KHz, prescribed value is 8 or 10, and frequency determined by multiplying the assigned frequency per one channel in AM radio broadcasting by the prescribed value is 72 or 90 KHz.

Another embodiment of the present invention provides a local oscillation circuit wherein a reference frequency of an oscillator is 75 KHz and assigned frequency per one channel in FM radio broadcasting is 50, 100, or 200 KHz.

Still another embodiment of the present invention provides a local oscillation circuit wherein a frequency doubler circuit which multiplies the frequency of the reference oscillation signal outputted from the reference oscillator by two's power, for example by $2^2$.

According to the above-mentioned present invention, by multiplying a frequency of a reference oscillation signal outputted from a reference oscillator, the greatest common divisor between the frequency of the multiplied reference oscillation signal and an assigned frequency per one channel in AM radio broadcasting or a frequency determined by multiplying the assigned frequency divided by an integer by a prescribed divide ratio or the greatest common divisor between the frequency of the multiplied reference oscillation signal and an assigned frequency per one channel in FM radio broadcasting or the assigned frequency divided by an integer increases and the frequency of the reference oscillation signal, which becomes a reference when a local oscillation signal is generated, can be comparatively large. Therefore, the divide ratio in the local oscillation circuit can be smaller, resulting in the reduced circuit scale, shorter lock-up period, and improved S/N ratio.

DETAILED DESCRIPTION OF THE PREFERRED EMBODIMENTS

Figure 1:
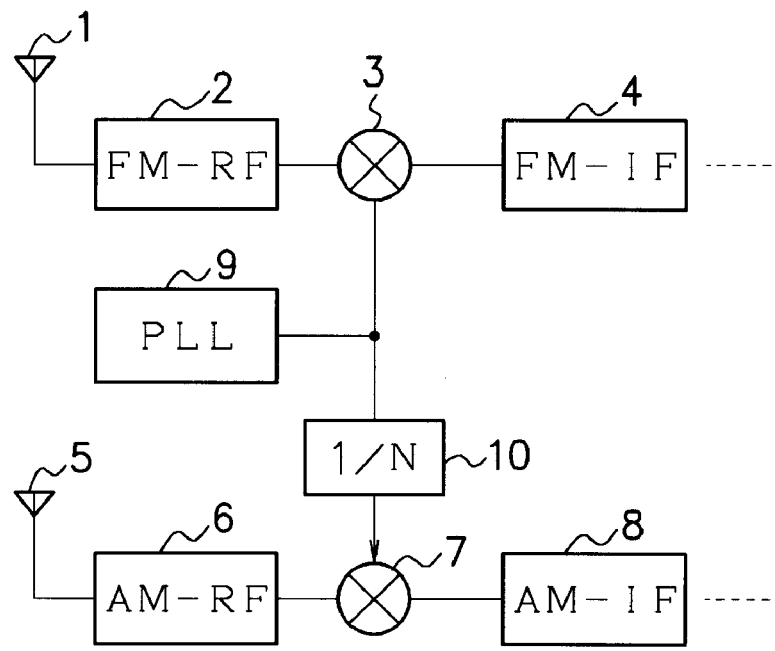
FIG. 1 is a functional block diagram showing an example of partial configuration of a radio receiver comprising one PLL circuit for both AM and FM broadcasting.
Figure 2:
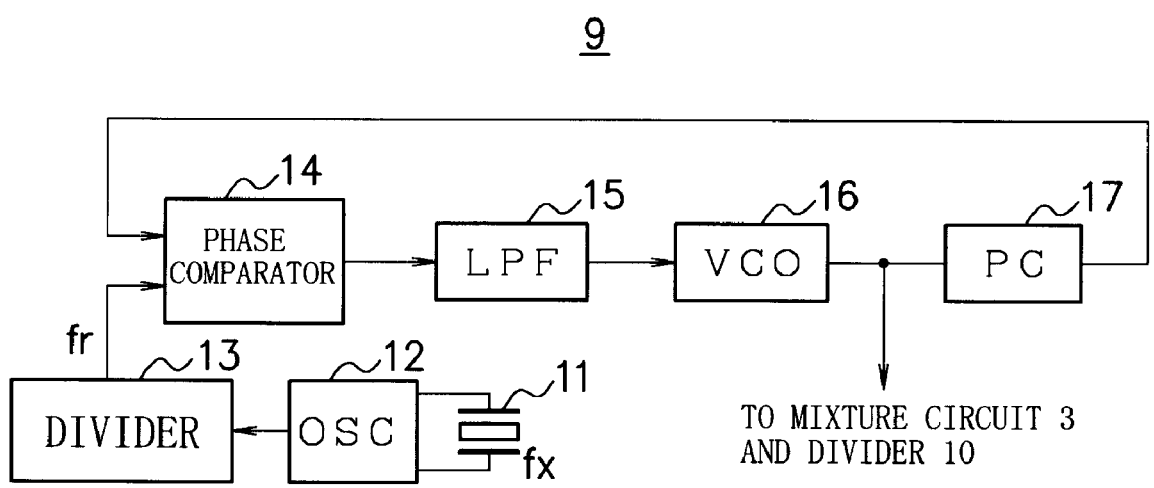
FIG. 2 shows a configuration example of the conventional PLL circuit.
Figure 3:
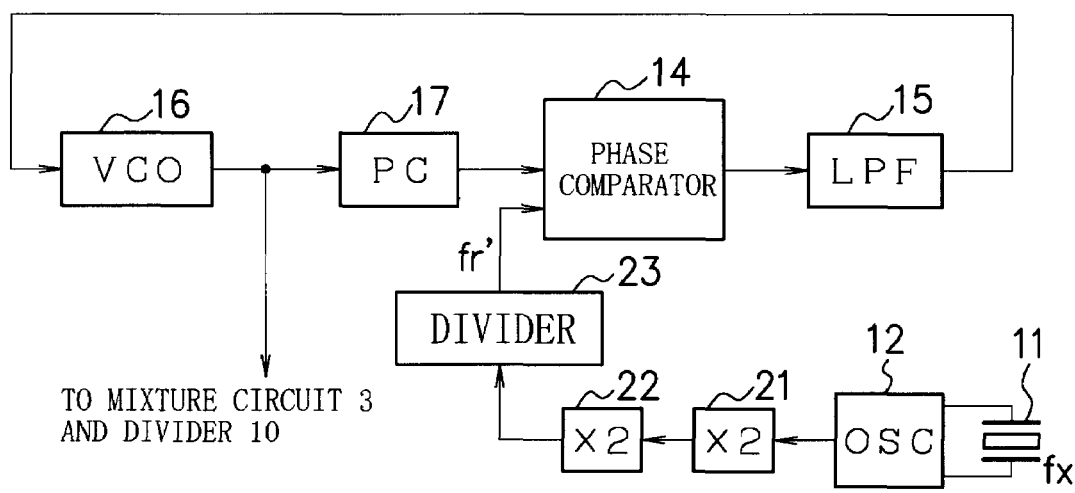
FIG. 3 shows a configuration example of the local oscillation circuit (PLL circuit) according to the present embodiment.

An embodiment of the present invention is now described in detail by referring to the attached drawings. FIG. 3 shows a configuration example of the local oscillation circuit (PLL circuit) according to one embodiment of the present invention. Since the several structural elements in FIG. 3 have the identical functions to those in FIG. 2, redundant description of these structural elements will be omitted by applying the same reference numbers as in FIG. 2. A configuration of the AM/FM radio receiver wherein the PLL circuit in FIG. 3 is applied to is as shown in FIG. 1.

As shown in FIG. 3, the PLL circuit of the present embodiment comprises a crystal oscillator 11, reference oscillator (OSC) 12, divider 23, phase comparator 14, low pass filter (LPF) 15, voltage-controlled oscillator (VCO) 16, programmable counter (PC) 17, and a couple of frequency doubler circuits 21 and 22.

Figure 4:
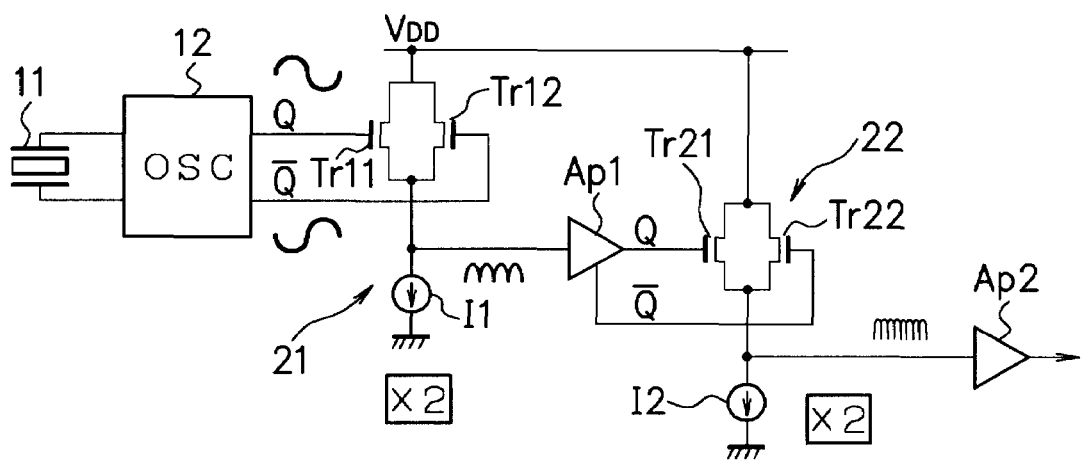
FIG. 4 shows a configuration example of the frequency doubler circuit according to the present embodiment.

Through a couple of frequency doublers 21 and 22, the frequency of the reference oscillation signal outputted from the reference oscillator 12 is multiplied by $2^2$. FIG. 4 shows a configuration example including the frequency doublers 21 and 22.

As shown in FIG. 4, the primary frequency doubler 21 comprises a differential pair including two transistors Tr11 and Tr12, constant current source I1, and amplifier Ap1. The sources of two transistors Tr11 and Tr12 constituting the differential pair are mutually connected, being earthed through the constant current source I1. The drains of the transistors Tr11 and Tr12 are mutually connected, being connected to a power supply VDD.

The reference oscillation signal outputted from the terminal Q of the reference oscillator 12 and a signal with a phase inverted to that of the above-mentioned reference oscillation signal outputted form the terminal Q bar of the reference oscillator 12 are inputted to the gates of the transistors Tr11 and Tr12, respectively, which allows the differential pair consisted of the transistors Tr11 and Tr12 to double the frequency of the inputted reference oscillation signal by the differential amplifying operation and to output the doubled frequency.

The reference oscillation signal with the frequency doubled by the differential pair is inputted to the amplifier Ap1. The amplifier Ap1 outputs both the reference oscillation signal and the phase-reversed signal thereto from the terminals Q and Q bar, respectively.

The secondary frequency doubler 22 comprises a differential pair including two transistors Tr21 and Tr22, constant current source 12, and amplifier Ap2. The sources of two transistors Tr21 and Tr22 constituting the differential pair are mutually connected, being earthed through the constant current source 12. The drains of the transistors Tr21 and Tr22 are mutually connected, being connected to a power supply VDD.

The reference oscillation signal outputted from the terminal Q of the amplifier Ap1 and the phase-reversed signal outputted from the terminal Q bar of the amplifier Ap1 are inputted to the gates of the transistor tr21 and Tr22, respectively, allowing the differential pair consisted of the transistors tr21 and Tr22 to additionally double by differential amplifying operation the frequency of the inputted reference oscillation and to output the doubled frequency. The reference oscillation signal additionally doubled by the differential pair is inputted to the divider 23 in FIG. 3 via the amplifier Ap2.

The divider 23 (corresponding to the second divider circuit of the present invention) divides the frequency of the reference oscillation signal outputted from the secondary frequency doubler 22 to generate a reference oscillation signal with a frequency $f_r'$ of the greatest common divisor between the frequency of the reference oscillation signal outputted from the frequency doubler circuit 22 and the assigned frequency per one channel in AM radio broadcasting or the frequency determined by multiplying the assigned frequency divided by an integer by the divide ratio of the divider 10 (corresponding to the first divider circuit of the present invention), outputting the signal to the phase comparator 14.

Here, the frequency of the reference oscillation signal outputted from the reference oscillator 12 is 75 KHz which is the operating frequency fx of the crystal oscillator 11. In this case, through the couple of the frequency doubler circuits 21 and 22, the frequency of the reference oscillation signal is increased to 300 KH. On the other hand, since the divide ratio in the divider 10 for AM is 1/6 as mentioned above and the bandwidth occupied by one channel in Japanese AM broadcast is 9 KHz, the frequency calculated by multiplying the assigned frequency per one channel in AM radio broadcasting by the divide ratio of the divider 10 is 54 KHz.

Therefore, the divider 23 produces a reference oscillation signal with a frequency $f_r'$ of 6 KHz which is the greatest common divisor between 300 KHz and 54 KHz to be outputted to the phase comparator 14. According to the embodiment, the reference oscillation signal with a frequency two times greater than that ($f_r$=3 KHz) of the conventional signal may be supplied to the phase comparator 14 as a comparison reference signal. If 3 KHz is used as a frequency defined by dividing the assigned frequency (9 KHz) per one channel in AM radio broadcast by an integer, the frequency calculated by multiplying 3 KHz by the divide ratio of the divider 10 is 18 KHz. A frequency $f_r'$ of the greater common divisor between the resulting frequency 18 KHz and the outputted frequency 300 KHz from the frequency doubler 22 is also 6 KHz.

In the above embodiment, 75 KHz of the reference oscillation signal outputted from the reference oscillator 12 is multiplied by $2^2$ to 300 KHz. This multiplication has particular meanings in $2^2$. The PLL circuit including the doubler which multiplies the frequency by $2^n$ can be easily manufactured and has less complicated configuration in compared with that including the multiplier which multiplies the frequency by $X^n$ such as $3^n$ and $5^n$ other than $2^n$. Specifically, if the multiplier multiplies the frequency by $3^n$, $5^n$, or the like, the PLL circuit needs to have an additional filter circuit and the like to align the phase deviation between the original reference oscillation signal and multiplied signal by $3^n$, $5^n$, or the like.

The reason that the multiplying factor is less than four is to prevent the multiplied reference oscillation frequency from being superimposed on the AM broadcast wave which may occur when the multiplying factor is unreasonably greater such as $2^3$ and $2^4$. Specifically, the frequency defined by multiplying 75 KHz by $2^3$ or $2^4$ is respectively 600 KHz or 1200 KHz, which is overlapped with the frequency band (531-1620 KHz) allocated for AM broadcasting.

On the other hand, the PLL circuit may have a configuration including only one stage of the frequency doubler because the obtained frequency by multiplying the reference oscillation frequency of 75 KHz by two is 150 HKz which is not overlapped with AM broadcasting band and a frequency fr' of a reference oscillation signal to be supplied to the phase comparator 14 is 6 KHz which is two times greater than the conventional frequency.

However, when the PLL circuit of the present embodiment is shared not only by the mixture circuit for FM (corresponding to the first mixture circuit in the present invention) and the mixture circuit for AM (corresponding to the second mixture circuit in the present invention) but also by the other circuit, it may be preferable to produce the greater frequency by multiplying the reference oscillation frequency by four.

Figure 5:
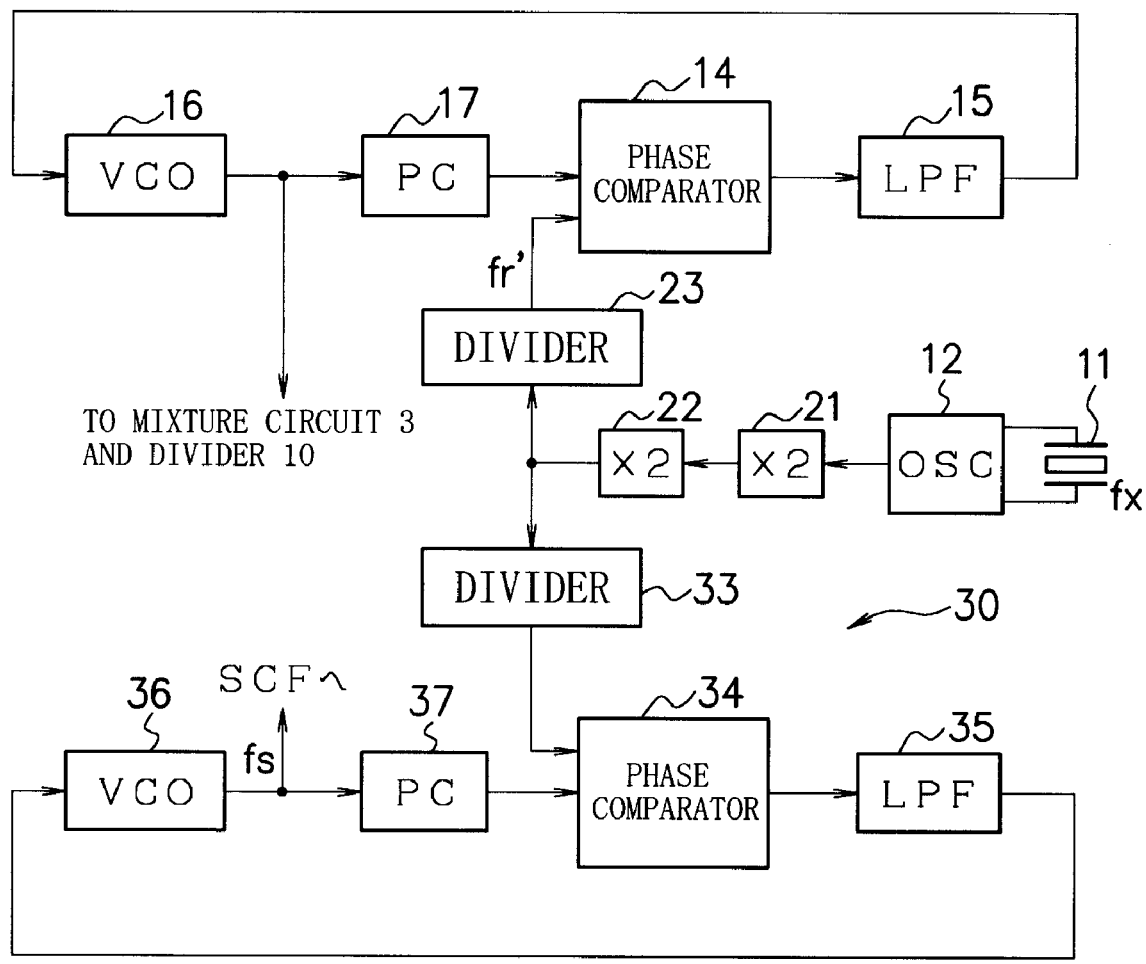
FIG. 5 shows an application example of the PLL circuit according to the present embodiment.

FIG. 5 is an application example of the PLL circuit being shared by the other circuit in addition to the mixture circuits for FM and AM. The structural element in FIG. 5 having the identical function to that in FIG. 3 is applied the same reference number as in FIG. 3. In the application example in FIG. 5, a clock generating circuit 30 is further provided in addition to the configuration in FIG. 3. The clock generating circuit 30 generates a clock signal to be supplied to a switched capacitor filter not shown in FIG. 5 by using 300 KHz of reference oscillation signal outputted from the frequency doubler 22.

The switched capacitor filter has a configuration so that the pass band characteristics of signals are variable by changing the capacity of a switched capacitor provided in the filter and is used for a tuning oscillation circuit, noise filter and the like. In the switched capacitor comprising a switch and capacitor, alternating the switch based on the clock signal generated in the clock generating circuit 30 may vary the capacity of the capacitor.

As shown in FIG. 5, the clock generating circuit 30 comprises a divider 33, phase comparator 34, low pass filter (LPF) 35, voltage-controlled oscillator (VCO) 36, and programmable counter (PC) 37. The divider 33 divides the frequency of the reference oscillation signal outputted from the frequency doubler 22 to output the resulting frequency to the phase comparator 34.

The phase comparator 34 compares the phases between the reference oscillation signal from the divider 33 and the outputted signal from the programmable counter 37 to output the voltage corresponding to the phase difference to the low pass filter 35. The low pass filter 35 removes the undesirable frequency component in the voltage outputted from the phase comparator 34 to generate the direct controlling voltage to be supplied to the voltage-controlled oscillator 36.

The voltage-controlled oscillator 36 changes the oscillation frequency according to the outputted voltage from the low pass filter 35 to output a clock signal with a sampling frequency $f_s$ controlled so as to be synchronized with the reference oscillation signal. The programmable counter 37 divides the clock signal outputted from the voltage-controlled oscillator 36 by a prescribed divide ratio to output the resulting signal to the phase comparator 34.

In the clock generating circuit 30 having such configuration, it is desired to increase the sampling frequency $f_s$ of the clock signal outputted from the voltage-controlled oscillator 36 as much as possible. If the sampling frequency $f_s$ is small, the frequency band of the signal inputted to the switched capacitor filter may be easily affected by the aliasing noise and the sufficient filtering effect may not be expected.

There are two methods to increase the sampling frequency $f_s$. One is a method to by increase the divide ratio of the programmable counter 37, and the other is a method to increase the frequency of the reference oscillation signal to be supplied to the phase comparator 34. However, the increased divide ratio of the programmable counter 37 degrades the stableness in locking operation, resulting in unstable clock signal to be obtained. Therefore, the method of increasing the divide ratio of the programmable counter 37 is not preferable.

Moreover, in the case that the clock generating circuit 30 comprising the LPF 35 which includes a capacitor is integrated into a circuit, it is preferable to decrease the divide ratio of the programmable counter 37 as small as possible. Because the greater the divide ratio of the programmable counter 37, the greater the time constant of the LPF 35, a capacitor with a large volume is indispensable which makes the difficulty in the IC.

Taking the above into account, in the clock generating circuit 30, it is desirable to increase the frequency of the reference oscillation signal inputted to the phase comparator 34 as much as possible. The greater the frequency of the reference oscillation signal, the smaller the divide ratio of the programmable counter 37, resulting in the secured operation stability and the smaller volume of the capacitor in the LPF 35 to realize the integration into one chip. For example, it is possible to integrate the circuits except for LPF 15 in FIG. 5 into one chip.

It is possible to provide only one stage of the frequency doubler to double 75 KHz of the reference oscillation frequency when the setting of a frequency $f_r'$ of the reference oscillation signal at 6 KHz to be supplied to the phase comparator 14 is only taken into consideration. However, it is preferable to multiply 75 KHz of the reference oscillation frequency by four by providing a couple of frequency doublers 21 and 22 in the case that the supply of the reference oscillation signal to the clock generating circuit 30 which generates the clock signal to the switched capacitor filter is taken into account.

While the reference oscillation signal outputted from the frequency doubler 22 is divided in the divider 33 in FIG. 5, the reference oscillation signal may be supplied to the phase comparator 34 without dividing. In this case, the frequency of the reference oscillation signal supplied to the phase comparator 34 may be greater as much as possible and, moreover, the divide ratio of the programmable counter 37 may be smaller as far as possible.

As described the detailed above, in the present embodiment having a configuration of multiplying the frequency of the reference oscillation signal outputted from the reference oscillator 12 in a couple of frequency doubler circuits 21 and 22 and of dividing the reference oscillation signal outputted from a couple of the frequency doubler circuits 21 and 22 to supply the resulting signal to the phase comparator 14, the greatest common divisor between a frequency of the reference oscillation signal of 300 KHz determined by multiplying 75 KHz by $2^2$ and a frequency of 54 KHz determined by multiplying the allocated frequency per one channel in AM radio broadcasting by a prescribed divide ratio become greater, resulting in the greater frequency of the reference oscillation signal to be supplied to the phase comparator 14 than that of the conventional signal.

This may realize the smaller divide ratio in the programmable counter 17 as well as the reduced circuit scale, decreased locking up time, and improved S/N ratio. In the case that the reference oscillation signal is also supplied to the clock generating circuit 30 for the switched capacitor filter as shown in FIG. 5, the divide ratio of the programmable counter 37 in the clock generating circuit 30 may be smaller by multiplying the reference oscillation frequency by four instead of two.

When a crystal oscillator with an operation frequency of 300 KHz is used in the PLL circuit, the same operation is expected without using the frequency doublers 21 and 22. However, the configuration having the crystal oscillator with an operation frequency of 75 KHz generally used in the current radio receivers has an advantage in producing cheaper products compared to the configuration having the crystal oscillator with an operation frequency of 300 KHz which need to be newly produced.

The above-mentioned present embodiment may be applied to the case of the European and American radio bands in the same way as in the Japanese radio band described above. In North, Central, and South American radio band, the frequency allocation in FM broadcasting is 88.1-107.9 MHz and the bandwidth occupied by one channel is 200 KHz. The local oscillation frequency $f_{FMLO}$ of each channel required for tuning is 10.7 MHz higher than the carrying frequency $f_{FMRX}$ of the channel, which is 98.8-118.6 MHz. On the other hand, the frequency allocation in AM broadcasting is 530-1710 KHz and the bandwidth occupied by one channel is 10 KHz. The local oscillation frequency $f_{AMLO}$ of each channel necessary for tuning is 10.7 MHz higher than the carrying frequency $f_{AMRX}$, which is 11.23-12.41 MHz.

The frequency eight times higher than the frequency $f_{AMLO}$ of 11.23-12.41 MHz is $8 \times f_{AMLO}$=89.84-99.28 MHz, which is partially superimposed on the frequency $f_{FMLO}$ of 98.8-118.6 MHz of the local oscillation signal for FM broadcast tuning. That is, the higher frequency range of the frequency eight times higher than the frequency $f_{AMLO}$ of the AM local oscillation signal and the lower frequency range of the frequency $f_{FMLO}$ of the FM local oscillation signal overlap each other.

While, the frequency ten times higher than the frequency $f_{AMLO}$ of 11.23-12.41 MHz is $10 \times f_{AMLO}$=112.3-124.1 MHz, which is partially superimposed on the frequency $f_{FMLO}$ of 98.8-118.6 MHz of the local oscillation signal for FM broadcast tuning. That is, the lower frequency range of the frequency ten times higher than the frequency $f_{AMLO}$ of the AM local oscillation signal and the higher frequency range of the frequency $f_{FMLO}$ of the FM local oscillation signal overlap each other.

If the lowest frequency coverage in the frequency $f_{FMLO}$ of the FM local oscillation signal is lowered from 98.8 MHz to 89.84 MHz or less, all the frequency eight times larger than the frequency $f_{AMLO}$ of the AM local oscillation signal is within the range of the frequency $f_{FMLO}$ of the FM local oscillation signal. Also, if the highest frequency coverage in the frequency $f_{FMLO}$ of the FM local oscillation signal is raised from 118.6 MHz to 124.1 MHz or more, all the frequency ten times larger than the frequency $f_{AMLO}$ of the AM local oscillation signal is within the range of the frequency $f_{FMLO}$ of the FM local oscillation signal.

Therefore, by expanding the coverage of the frequency $f_{FMLO}$ of the FM local oscillation signal to either the lower frequency side or the higher frequency side in addition to the setup for the divide ratio of the divider 10 shown in FIG. 1 to 1/8 (N=8) or 1/10 (N=10), the local oscillation signal for both FM and AM broadcasting can be obtained from one PLL circuit 9. Since Q of a varactor diode included in the oscillation circuit is lowered by the lower frequency, the oscillation circuit is difficult to oscillate. Thus, it is preferable to extend the coverage of the frequency $f_{FMLO}$ of the FM local oscillation signal to the higher frequency side in terms of the simple circuit configuration.

When a divide ratio of 1/8 in the divider 10 is used in the North, Central, and South American band mentioned above, the greater common divisor of 5 KHz between 80 KHz which is eight times greater than an allocated frequency for one channel in AM broadcasting of 10 KHz and 75 KHz in the crystal oscillator 11 may be employed as the reference oscillation signal originally. On the contrary, in the case that a frequency of 75 KHz is doubled or quadrupled, a reference oscillation signal with a frequency $f_r'$ of 10 KHz or 20 KHz can be generated, respectively, followed by the phase comparator 14.

When a divide ratio of 1/10 in the divider 10 is used, the greater common divisor of 25 KHz between 100 KHz which is 10 times greater than an allocated frequency of 10 KHz and 75 KHz in the crystal oscillator 11 may be employed as the reference oscillation signal originally. In the case that a frequency of 75 KHz is doubled or quadrupled, a reference oscillation signal with a frequency $f_r'$ of 50 KHz or 100 KHz can be generated, respectively, followed by the phase comparator 14.

In European radio band, the allocated frequency for FM broadcasting is in the range of 87.5-108.0 MHz and an occupied bandwidth per one channel is 50 KHz. The local oscillation frequency $f_{FMLO}$ of each channel required for tuning is 10.7 MHz higher than the carrying frequency $f_{FMRX}$ of the channel, being in the range of 98.2-118.7 MHz. On the other hand, the allocated frequency for AM broadcasting is in the range of 531-1620 KHz and an occupied bandwidth per one channel is 9 KHz. The local oscillation frequency $f_{AMLO}$ of each channel required for tuning is 10.7 MHz higher than the carrying frequency $f_{AMRX}$ of the channel, being in the range of 11.231-12.320 MHz.

The frequency eight times larger than the frequency $f_{AMLO}$ of 11.231-12.320 MHz is $8 \times f_{AMLO}$=89.848-98.56 MHz, which is partially superimposed on the frequency $f_{FMLO}$ of 98.2-118.7 MHz of the local oscillation signal for FM broadcast tuning. That is, the higher frequency range of the frequency eight times larger than the frequency $f_{AMLO}$ of the AM local oscillation signal and the lower frequency range of the frequency $f_{FMLO}$ of the FM local oscillation signal overlap each other.

In the meantime, the frequency ten times larger than the frequency $f_{AMLO}$ of 11.231-12.320 MHz is $10 \times f_{AMLO}$=112.31-123.2 MHz, which is partially superimposed on the frequency $f_{FMLO}$ of 98.2-118.7 MHz of the local oscillation signal for FM broadcast tuning. That is, the lower frequency range of the frequency ten times larger than the frequency $f_{AMLO}$ of the AM local oscillation signal and the higher frequency range of the frequency $f_{FMLO}$ of the FM local oscillation signal overlap each other.

If the lowest frequency coverage in the frequency $f_{FMLO}$ of the FM local oscillation signal is lowered from 98.2 MHz to 89.848 MHz or less, all the frequency eight times larger than the frequency $f_{AMLO}$ of the AM local oscillation signal comes into the range of the frequency $f_{FMLO}$ of the FM local oscillation signal. If the highest frequency coverage in the frequency $f_{FMLO}$ of the FM local oscillation signal is raised from 118.7 MHz to 123.2 MHz or more, all the frequency ten times larger than the frequency $f_{AMLO}$ of the AM local oscillation signal comes into the range of the frequency $f_{FMLO}$ of the FM local oscillation signal.

Therefore, by extending the coverage of the frequency $f_{FMLO}$ of the FM local oscillation signal to either the lower frequency side or the higher frequency side in addition to the setup for the divide ratio of the divider 10 shown in FIG. 1 to 1/8 (N=8) or 1/10 (N=10), the local oscillation signal for both FM and AM broadcasting can be obtained from one PLL circuit 9. It is preferable to extend the coverage of the frequency $f_{FMLO}$ of the FM local oscillation signal to the higher frequency side in terms of the simple circuit configuration.

When a divide ratio of 1/8 is used for the divider 10 in European band mentioned above, since an allocated frequency for one channel in AM broadcasting is 9 KHz, the greatest common divisor between 72 KHz which is eight times greater than the allocated frequency of 9 KHz and 75 KHz in the crystal oscillator 11 is only 3 KHz for the reference oscillation signal. On the contrary, when a frequency of 75 KHz is doubled or quadrupled, a reference oscillation signal with a frequency $f_r'$ of 6 KHz or 12 KHz, respectively, can be generated, being supplied to the phase comparator 14.

In the case of a divider ratio of 1/10 is used for the divider 10, the greater common divisor of 15 KHz between 90 KHz which is 10 times greater than the allocated frequency per one channel in AM broadcasting and 75 KHz in the crystal oscillator 11 can be employed as a frequency of the reference oscillation signal originally. Meanwhile, when a frequency of 75 KHz is doubled or quadrupled, a reference oscillation signal with a frequency $f_r'$ of 30 KHz, respectively, can be generated, followed by the phase comparator 14.

The above embodiment of the present invention is one example, wherein by dividing the reference oscillation signal outputted from a couple of frequency doublers 21 and 22 the reference oscillation signal with a frequency $f_r'$ of the greatest common divisor between the multiplied frequency and the allocated frequency per one channel in AM radio broadcasting or the frequency dividing the allocated frequency by one integer may be generated. Additionally, the present invention include the embodiment wherein the reference oscillation signal with a frequency of the greatest common divisor between the multiplied frequency and the allocated frequency per one channel in FM radio broadcasting or the frequency determined by dividing the allocated frequency by one integer may be generated.

In Japanese radio band, the FM local oscillation frequency $f_{FMLO}$ is in the range of 65.4-79.2 MHz and the occupied bandwidth per one channel is 100 KHz as mentioned above. In this case, a frequency of 25 KHz, the greatest common divisor between 75 KHz in the crystal oscillator 11 and 100 KHz or 25 KHz which is determined by dividing 100 KHz by one integer, may be used as a frequency of a reference oscillation signal originally. On the contrary, when a frequency of 75 KHz is doubled or quadrupled, a reference oscillation signal with a frequency of 50 KHz or 100 KHz can be generated, respectively.

In North, Central, and South American radio band, the FM local oscillation frequency $f_{FMLO}$ is in the range of 98.8-118.6 MHz and the occupied bandwidth per one channel is 200 KHz as mentioned above. Likewise, a frequency of 25 KHz, the greatest common divisor between 75 KHz in the crystal oscillator 11 and 200 KHz or 25 KHz which is determined by dividing 200 KHz by one integer, may be used as a frequency of a reference oscillation signal originally. On the contrary, when a frequency of 75 KHz is doubled or quadrupled, a reference oscillation signal with a frequency of 50 KHz or 100 KHz can be generated, respectively.

Furthermore, in European radio band, the FM local oscillation frequency $f_{FMLO}$ is in the range of 98.2-118.7 MHz and the occupied bandwidth per one channel is 50 KHz. Likewise, a frequency of 25 KHz, the greatest common divisor between 75 KHz in the crystal oscillator 11 and 50 KHz or 25 KHz which is determined by dividing 50 KHz by one integer, may be used as a frequency of a reference oscillation signal originally. On the contrary, when a frequency of 75 KHz is doubled or quadrupled, a reference oscillation signal with a frequency of 50 KHz may be generated, respectively.

Although the crystal oscillator 11 is used in the above-mentioned embodiment, an oscillator other than the crystal may be applied to the present invention. Although the crystal oscillator 11 in the above-mentioned embodiment generates a frequency of 75 KHz of the reference oscillation signal, an oscillator with an operating frequency other than 75 KHz may be used to generate a reference oscillation signal. However, it is preferable to use a commercially available oscillator with a common operating frequency to be multiplied by a constant number.

By the way, the above-described embodiment is not more than a specific example in implementing the present invention and this should not be interpreted as restricting the technological scope of the present invention. That is, the invention may be embodied in other specific forms without departing from the spirit or essential characteristic thereof.

INDUSTRIAL APPLICABILITY

The present invention is useful for an AM/FM radio receiver having a configuration so as to generate a local oscillation signal for AM and FM broadcasting by one PLL circuit.

What is claimed is:

1. An AM/FM radio receiver, comprising:
a local oscillation circuit which generates a local oscillation signal;
first mixture circuit which mixes the local oscillation signal outputted from said local oscillation circuit and a FM radio broadcast signal to generate an intermediate frequency signal for FM broadcasting;
first divide circuit which divides the local oscillation signal outputted from said local oscillation circuit; and
second mixture circuit which mixes the local oscillation signal divided in said first divide circuit and an AM radio broadcast signal to generate an intermediate frequency signal for AM broadcasting;
wherein said local oscillation circuit, comprising:
an oscillator which operates with a prescribed reference frequency;
reference oscillator which generates a reference oscillation signal using said oscillator;
frequency doubler circuit which multiplies the frequency of the reference oscillation signal outputted from said reference oscillator; and
second divide circuit which divides the reference oscillation signal outputted from said frequency doubler circuit to generate a reference oscillation signal with a frequency of the greatest common divisor between the frequency of the reference oscillation signal outputted from said frequency doubler circuit and an assigned frequency per one channel in AM radio broadcasting or the frequency determined by multiplying the assigned frequency divided by an integer by a divide ratio of said first divide circuit.

2. The AM/FM radio receiver according to claim 1, wherein the reference frequency of said oscillator is 75 KHz, said assigned frequency per one channel in AM radio broadcasting is 9 KHz, the divide ratio of said first divide circuit is 1/6, and the frequency determined by multiplying the assigned frequency per one channel in AM radio broadcasting by the divide ratio of said first divide circuit is 54 KHz.

3. The AM/FM radio receiver according to claim 1, wherein the reference frequency of said oscillator is 75 KHz, said assigned frequency per one channel in AM radio broadcasting is 10 KHz, the divide ratio of said first divide circuit is 1/8 or 1/10, and the frequency determined by multiplying the assigned frequency per one channel in AM radio broadcasting by the divide ratio of said first divide circuit is 80 or 100 KHz.

4. The AM/FM radio receiver according to claim 1, wherein the reference frequency of said oscillator is 75 KHz, said assigned frequency per one channel in AM radio broadcasting is 9 KHz, the divide ratio of said first divide circuit is 1/8 or 1/10, and the frequency determined by multiplying the assigned frequency per one channel in AM radio broadcasting by the divide ratio of said first divide circuit is 72 or 90 KHz.

5. The AM/FM radio receiver according to claim 1, wherein said frequency doubler circuit multiplies the frequency of the reference oscillation signal outputted from said reference oscillator by two's power.

6. The AM/FM radio receiver according to claim 5, wherein said frequency doubler circuit multiplies the frequency of the reference oscillation signal outputted from said reference oscillator by $2^2$.

7. The AM/FM radio receiver according to claim 1, further comprising:
a clock generating circuit which generates a clock signal to be supplied to a switched capacitor filter having a configuration so that passband characteristics are variable by changing the capacity of the switched capacitor;
wherein said clock generating circuit generates said clock signal using the reference oscillation signal outputted from said frequency doubler circuit.

8. An AM/FM radio receiver, comprising:
a local oscillation circuit which generates a local oscillation signal;
first mixture circuit which mixes the local oscillation signal outputted from said local oscillation circuit and a FM radio broadcast signal to generate an intermediate frequency signal for FM broadcasting;
first divide circuit which divides the local oscillation signal outputted from said local oscillation circuit; and
second mixture circuit which mixes the local oscillation signal divided in said first divide circuit and an AM radio broadcast signal to generate an intermediate frequency signal for AM broadcasting;
wherein said local oscillation circuit, comprising:
an oscillator which operates with a prescribed reference frequency;
reference oscillator which generates a reference oscillation signal using said oscillator;
frequency doubler circuit which multiplies the frequency of the reference oscillation signal outputted from said reference oscillator; and
second divide circuit which divides the reference oscillation signal outputted from said frequency doubler circuit to generate a reference oscillation signal with a frequency of the greatest common divisor between the frequency of the reference oscillation signal outputted from said frequency doubler circuit and an assigned frequency per one channel in FM radio broadcasting or the assigned frequency divided by an integer.

9. The AM/FM radio receiver according to claim 8,
wherein the reference frequency of said oscillator is 75 KHz, said assigned frequency per one channel in FM radio broadcasting is 50, 100, or 200 KHz.

10. The AM/FM radio receiver according to claim 8,
wherein said frequency doubler circuit multiplies the frequency of the reference oscillation signal outputted from said reference oscillator by two's power.

11. The AM/FM radio receiver according to claim 10,
wherein said frequency doubler circuit multiplies the frequency of the reference oscillation signal outputted from said reference oscillator by $2^2$.

12. The AM/FM radio receiver according to claim 8, further comprising:
a clock generating circuit which generates a clock signal to be supplied to a switched capacitor filter having a configuration so that passband characteristics are variable by changing the capacity of the switched capacitor;
wherein said clock generating circuit generates said clock signal using the reference oscillation signal outputted from said frequency doubler circuit.

13. A local oscillation circuit, comprising:
an oscillator which operates with a prescribed reference frequency;
reference oscillator which generates a reference oscillation signal using said oscillator;
frequency doubler circuit which multiplies the frequency of the reference oscillation signal outputted from said reference oscillator; and
divide circuit which divides the reference oscillation signal outputted from said frequency doubler circuit to generate a reference oscillation signal with a frequency of the greatest common divisor between the frequency of the reference oscillation signal outputted from said frequency doubler circuit and an assigned frequency per one channel in AM radio broadcasting or the frequency determined by multiplying the assigned frequency divided by an integer by a prescribed value.

14. The local oscillation circuit according to claim 13,
wherein the reference frequency of said oscillator is 75 KHz, said assigned frequency per one channel in AM radio broadcasting is 9 KHz, said prescribed value is 6, and the frequency determined by multiplying the assigned frequency per one channel in AM radio broadcasting by said prescribed value is 54 KHz.

15. The local oscillation circuit according to claim 13,
wherein the reference frequency of said oscillator is 75 KHz, said assigned frequency per one channel in AM radio broadcasting is 10 KHz, said prescribed value is 8 or 10, and the frequency determined by multiplying the assigned frequency per one channel in AM radio broadcasting by said prescribed value is 80 or 100 KHz.

16. The local oscillation circuit according to claim 13,
wherein the reference frequency of said oscillator is 75 KHz, said assigned frequency per one channel in AM radio broadcasting is 9 KHz, said prescribed value is 8 or 10, and the frequency determined by multiplying the assigned frequency per one channel in AM radio broadcasting by said prescribed value is 72 or 90 KHz.

17. The local oscillation circuit according to claim 13,
wherein said frequency doubler circuit multiplies the frequency of the reference oscillation signal outputted from said reference oscillator by two's power.

18. The local oscillation circuit according to claim 17,
wherein said frequency doubler circuit which multiplies the frequency of the reference oscillation signal outputted from said reference oscillator by $2^2$.

19. A local oscillation circuit, comprising:
an oscillator which operates with a prescribed reference frequency;
reference oscillator which generates a reference oscillation signal using said oscillator;
frequency doubler circuit which multiplies the frequency of the reference oscillation signal outputted from said reference oscillator; and
divide circuit which divides the reference oscillation signal outputted from said frequency doubler circuit to generate a reference oscillation signal with a frequency of the greatest common divisor between the frequency of the reference oscillation signal outputted from said frequency doubler circuit and an assigned frequency per one channel in FM radio broadcasting or the assigned frequency divided by an integer.

20. The local oscillation circuit according to claim 19,
wherein the reference frequency of said oscillator is 75 KHz and said assigned frequency per one channel in FM radio broadcasting is 50, 100, or 200 KHz.

21. The local oscillation circuit according to claim 19,
wherein said frequency doubler circuit multiplies the frequency of the reference oscillation signal outputted from said reference oscillator by two's power.

22. The local oscillation circuit according to claim 21,
wherein said frequency doubler circuit which multiplies the frequency of the reference oscillation signal outputted from said reference oscillator by $2^2$.

* * * * *

UNITED STATES PATENT AND TRADEMARK OFFICE
CERTIFICATE OF CORRECTION

| | |
|---|---|
| PATENT NO. | : 7,551,906 B2 |
| APPLICATION NO. | : 11/383087 |
| DATED | : June 23, 2009 |
| INVENTOR(S) | : Takeshi Ikeda et al. |

It is certified that error appears in the above-identified patent and that said Letters Patent is hereby corrected as shown below:

Title page item (73) Assignee to read as follows:

Niigata Seimitsu Co., Ltd., Jyoetsu-shi (JP); and Ricoh Co. Ltd., Tokyo (JP)

Signed and Sealed this

Twelfth Day of January, 2010

David J. Kappos
*Director of the United States Patent and Trademark Office*